(12) United States Patent
Kim et al.

(10) Patent No.: US 8,502,583 B2
(45) Date of Patent: Aug. 6, 2013

(54) HIGH-SPEED DUTY CYCLE CORRECTION CIRCUIT

(75) Inventors: Soo-Won Kim, Seoul (KR); Young-Jae Min, Seoul (KR)

(73) Assignee: Korea University Research and Business Foundation (KR)

( * ) Notice: Subject to any disclaimer, the term of this patent is extended or adjusted under 35 U.S.C. 154(b) by 0 days.

(21) Appl. No.: 13/422,400

(22) Filed: Mar. 16, 2012

(65) Prior Publication Data

US 2013/0106479 A1 May 2, 2013

(30) Foreign Application Priority Data

Oct. 28, 2011 (KR) .......................... 10-2011-0111344

(51) Int. Cl.
*H03K 3/017* (2006.01)
(52) U.S. Cl.
USPC .......................................... 327/175; 327/172
(58) Field of Classification Search
None
See application file for complete search history.

(56) References Cited

U.S. PATENT DOCUMENTS 6,967,514 B2 * 11/2005 Kizer et al. ................... 327/175

OTHER PUBLICATIONS

Young-Jae Min, et al., "A 0.31-1 GHz Fast-Corrected Duty-Cycle Corrector With Successive Approximation Register for DDR DRAM Applications," IEEE Transactions on Very Large Scale Integration Systems, 2011, pp. 1-5.

* cited by examiner

*Primary Examiner* — Cassandra Cox
(74) *Attorney, Agent, or Firm* — Cantor Colburn LLP (57) ABSTRACT

A circuit for correcting a duty-cycle comprises a duty-cycle adjuster for changing a duty-rate of an input clock signal according to a duty control signal; a duty-cycle detector for detecting a duty-rate of an output clock signal based on the input clock signal and the output clock signal from the duty-cycle adjuster; and an algorithm-based digital controller for performing an algorithm according to a duty-rate detection signal outputted from the duty-cycle detector to generate the duty control signal.

14 Claims, 10 Drawing Sheets

FIG. 14

HIGH-SPEED DUTY CYCLE CORRECTION CIRCUIT

BACKGROUND OF THE INVENTION

1. Field of the Invention

The present invention relates to a high-speed duty-cycle correction circuit, and more particularly to a high-speed duty-cycle correction circuit which is applied to an input and an output exposed from an outer surface of a semiconductor chip, or to an input and an output of each of a delay-locked loop (DLL) and a phase-locked loop (PLL) in the semiconductor chip to correct a duty-rate.

2. Description of the Related Art

In order to reduce a size of a basic cell of a dynamic random access memory (DRAM), research for a process for reducing a capacitor cell size of a DRAM, such as 4×nm, 3×nm, etc., has been conducted. Although the basic cell is significantly related to the DRAM size, due to the limits of DRAM process development, it has been demanded to reduce even a size of a DRAM internal circuit. Further, as mobile equipments have been pervasive widely, a memory has been required to include a circuit for rapidly switching from a power-down mode for low-power consumption to a normal operation mode, for high-speed and low-power consumption. In particular, in a clock generator which has an effect on power consumption, such as a delay-locked loop circuit, a phase-locked loop circuit, etc., a duty-cycle correction circuit has been required to have a small size as well as to perform a rapid switching.

For securing an effective data portion of semiconductor memory output data as much as possible, an inner clock used in a semiconductor memory must be guaranteed a 50:50 duty-rate symmetrically. However, since input and output clocks may be asymmetrical, there is a need for providing a duty-cycle correction circuit which can correct it.

An analog scheme of two schemes which are used in both a duty-cycle detector and a controller has a defect that it takes too long to compensate a duty error. So, it is not suitable to a system including a memory which is required to perform a rapid switching from a power-down mode to a normal operation mode. A digital control scheme may generate a duty-rate error due to a non-linear characteristic of a delay cell used in a time/digital converter, and its production cost become higher because of the time/digital converter size.

SUMMARY OF THE INVENTION

Accordingly, the present invention has been made to solve the above-mentioned problems occurring in the prior art, and the present invention provides a high-speed duty-cycle correction circuit which can be switch rapidly from a power-down mode to a normal operation mode and in which its area and linear characteristic are improved.

In accordance with an aspect of the present invention, there is provided a circuit for correcting a duty-cycle comprising: a duty-cycle adjuster for changing a duty-rate of an input clock signal according to a duty control signal; a duty-cycle detector for detecting a duty-rate of an output clock signal based on the input clock signal and the output clock signal from the duty-cycle adjuster; and an algorithm-based digital controller for performing an algorithm according to a duty-rate detection signal outputted from the duty-cycle detector to generate the duty control signal.

According to an embodiment of the present invention, the algorithm-based digital controller includes a successive approximation register (SAR) controller performs a SAR algorithm according to the duty-rate detection signal to generate the duty control signal.

According to an embodiment of the present invention, the duty-cycle detector includes an integrator for integrating a duty-rate difference of the output clock signal; and a latch for amplifying the duty-rate difference stored in the integrator to generate the duty-rate detection signal.

According to another embodiment of the present invention, the duty-cycle detector includes a delayed signal selector for delaying the output clock signal for a selecting duration of a divided-by-2 signal generated by dividing the input clock signal by two to generate a delayed signal and for outputting the delayed signal for a comparing duration of the divided-by-2 signal; an inverter for inverting the divided-by-2 signal; and a D flip-flop for outputting the delayed signal according to an inverted signal from the inverter, as the duty-rate detection signal.

According to an embodiment of the present invention, the delayed signal selector includes a multiplexor for selecting the output clock signal according to the divided-by-2 signal; n buffers connected in serial with one another for progressively delaying a signal output from the multiplexor; n D flip-flops for selectively outputting the output clock signal according to delayed signals from the n buffers; n logic circuits for detecting a level changing portion by comparing signals output from the n D flip-flops with one another; and an OR gate for selecting a signal delayed for a positive duty duration of the output clock signal among signals output from the n logic circuits.

According to an embodiment of the present invention, the duty cycle adjuster includes an inverter for inverting the input clock signal; a rising edge generator having a dummy delay line for delay an inverted signal from the inverter for a time period; and a falling edge generator for controlling the number of variable delay cells according to the duty control signal to delay the input clock signal.

According to another embodiment of the present invention, the duty cycle adjuster includes an inverter for inverting the input clock signal; a multiplexor for selectively outputting an inverted signal from the inverter and the input clock signal according to a sign signal corresponding to a duty-rate of the input clock signal; a rising edge generator having a dummy delay line for delaying a signal from the multiplexor for a time period; and a falling edge generator for controlling the number of variable delay cells according to the duty control signal to delay the signal from the multiplexer.

According to the present invention, it is possible to rapidly switch from a power-down mode to a normal-operation mode using a digital control scheme, and size and linear characteristics are improved by using a duty-cycle comparator of a single-bit scheme. Further, by using a controller having an algorithm of an SAR scheme, a rapid duty-correction can be accomplished.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EXEMPLARY EMBODIMENT

Hereinafter, exemplary embodiments of the present invention will be described with reference to the accompanying drawings. In the following description, the same elements will be designated by the same reference numerals although they are shown in different drawings. Further, various specific definitions found in the following description, such as specific values of packet identifications, contents of displayed information, etc., are provided only to help general understanding of the present invention, and it is apparent to those skilled in the art that the present invention can be implemented without such definitions. Further, in the following description of the present invention, a detailed description of known functions and configurations incorporated herein will be omitted when it may make the subject matter of the present invention rather unclear.

Throughout the specification, when it is described that a part includes a certain element, it is construed that the part does not exclude another element but can further include another element as long as there is no specifically contradictory description.

When the terms "approximately" and "substantially" in the specification are used to refer to a value the same as or closer to a natural error allowed in manufactures and materials, and are also used to prevent an unconscious infringer from improperly using the disclosure where accurate or absolute values are mentioned to help understanding of the specification.

Figure 1:
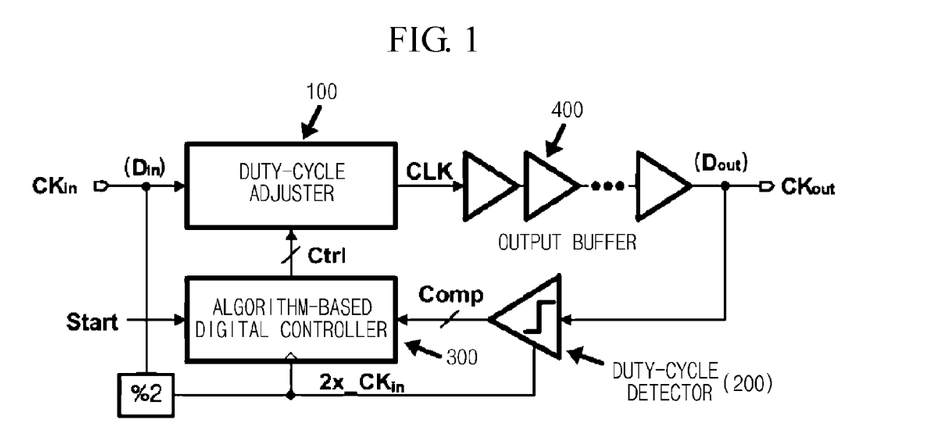
FIG. 1 is a block diagram illustrating a high-speed duty cycle correction circuit according to one embodiment of the present invention.
Figure 2:
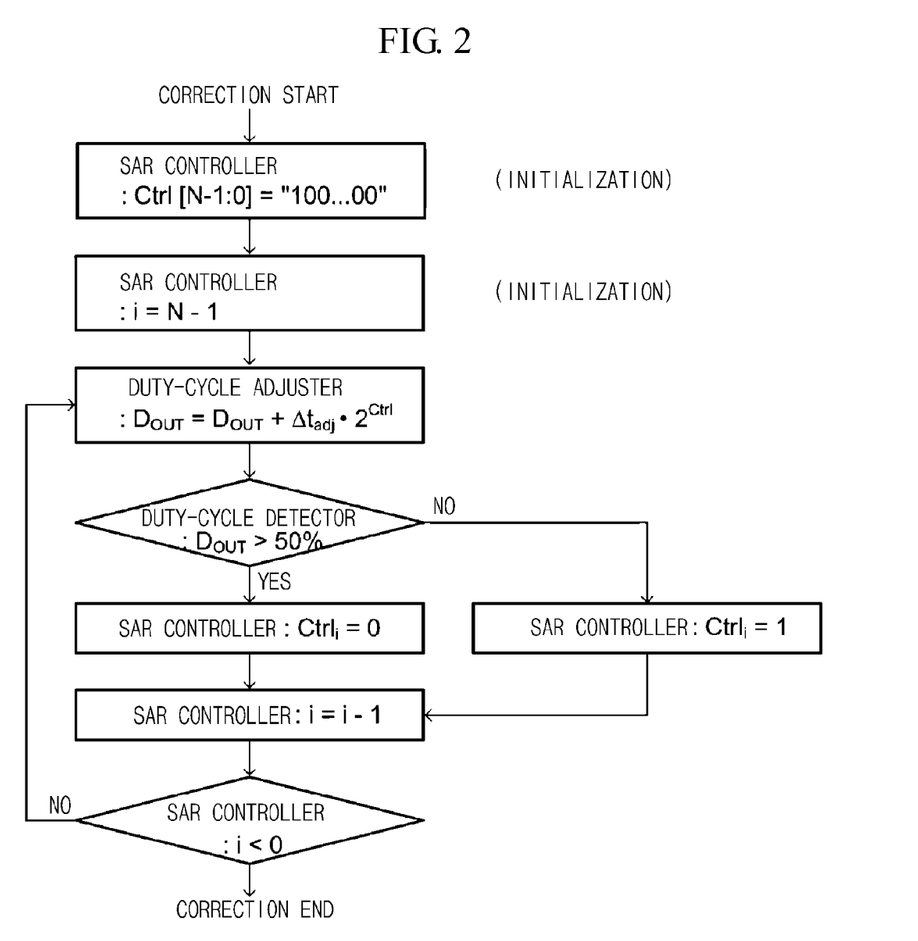
FIG. 2 is a flowchart illustrating an operation of a successive approximation register (SAR) controller depicted in FIG. 1.

FIG. 1 is a block diagram illustrating a high-speed duty cycle correction circuit according to one embodiment of the present invention. FIG. 2 is a flowchart illustrating an operation of a successive approximation register (SAR) controller depicted in FIG. 1.

First, referring to FIG. 1, a high-speed duty cycle correction circuit according to one embodiment of the present invention includes a duty-cycle adjuster 100, a duty-cycle detector 200, and an algorithm-based digital controller 300.

The duty-cycle adjuster 100 changes a duty-rate of an input clock signal CKin according to a duty control signal Ctrl, and outputs the duty-rate changed clock signal through one output buffer 400 or more as an output clock signal CKout.

The duty-cycle detector 200 detects a duty-rate of the output clock signal based on the input clock signal CKin and the output clock signal CKout from the duty-cycle adjuster 100, and generates a duty-rate detection signal Comp as a detection result.

The algorithm-based digital controller 300 performs an algorithm according to the duty-rate detection signal detected by the duty-cycle detector 200 to generate the duty control signal. For example, the algorithm-based digital controller 300 may be implemented by a SAR algorithm controller 300.

The SAR algorithm controller 300 performs a SAR algorithm, as show in FIG. 2, according to the duty-rate detection signal Comp from the duty-cycle detector 200 to generate the duty control signal Ctrl.

As shown in FIG. 2, when the SAR algorithm controller 300 starts to do the duty-cycle correction operation according to the duty-rate detection signal, it resets the duty control signal Ctrl and a parameter value i. When the duty control signal Ctrl is generated from the SAR algorithm controller 300, the duty-cycle adjuster 100 corrects the input clock signal CKin in units of $2^{Ctrl}$ times of a minimum amount of duty cycle compensation $\Delta t_{adj}$ according to the duty control signal Ctrl, such that the duty cycle of the input clock signal CKin is gradually and approximately adjusted to 50%. The duty control signal Ctrl is determined according to an output of the duty-cycle detector 200, such that the output of the duty-cycle adjuster 100 has the duty cycle of 50%.

Figure 3:
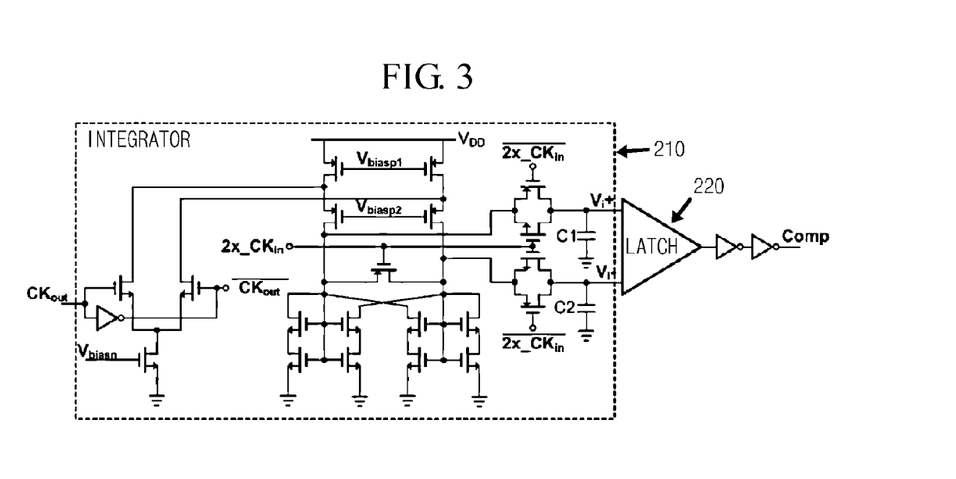
FIG. 3 is a circuit diagram illustrating one example of the duty-cycle detector 200 depicted in FIG. 1.
Figure 4:
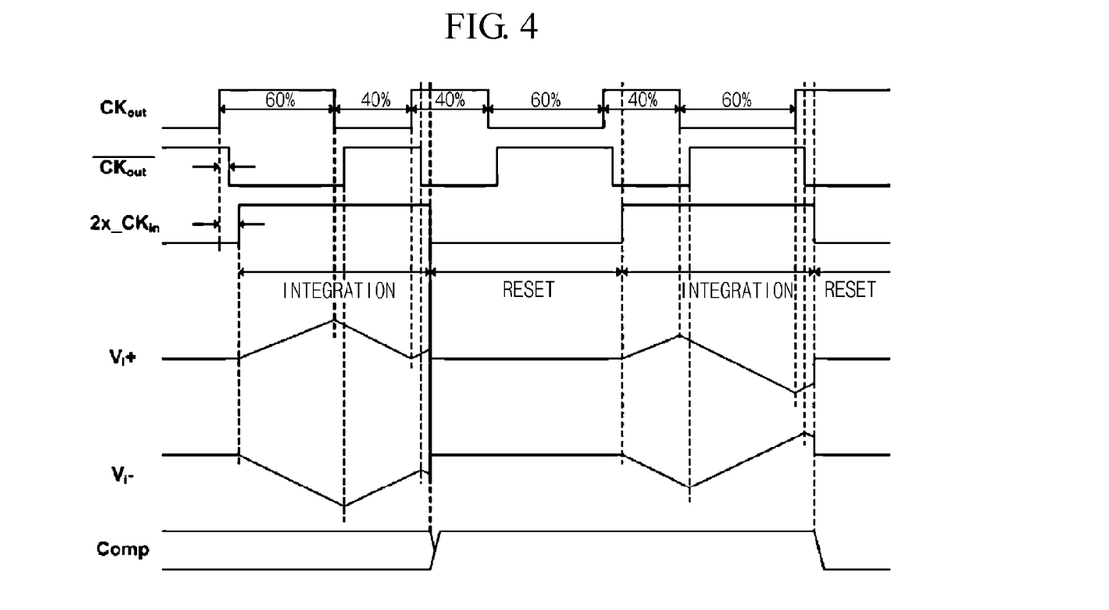
FIG. 4 is a view illustrating wave forms for explaining an operation of the duty cycle detector 200 depicted in FIG. 3.

FIG. 3 is a circuit diagram illustrating one example of the duty-cycle detector 200 depicted in FIG. 1. And, FIG. 4 is a view illustrating wave forms for explaining an operation of the duty cycle detector 200 depicted in FIG. 3.

Referring to FIG. 3, the duty-cycle detector 200 includes an integrator 210 and a latch 220.

The integrator 210 integrates a duty-rate difference of the output clock signal CKout, and outputs an integrated duty-ration difference to the latch 220.

The latch 220 amplifies the integrated duty-rate difference stored in the integrator to generate the duty-rate detection signal Comp.

As shown in FIG. 4, the duty-cycle detector 200 integrates a duty signal during a divided signal 2x_CKin that is generated by dividing an internal input signal by two and rate difference of the output clock signal CKout, and outputs the integrated voltage value, such that the duty-rate sign of the last duty-rate detection signal Comp is determined. As shown in FIG. 4, when the internal input signal having the positive duty-rate of 60% is input, the duty-rate detection signal has a value "1 (High)".

Figure 5:
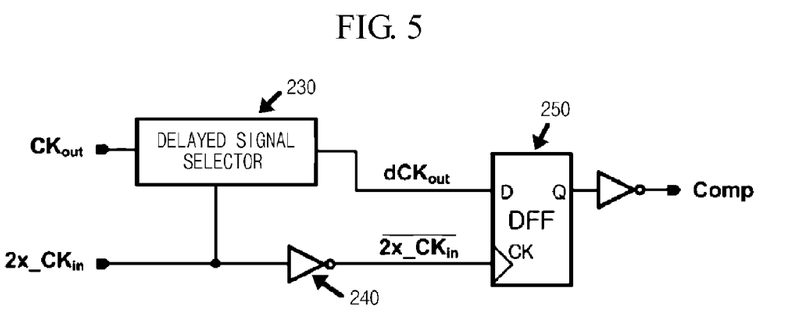
FIG. 5 is a circuit diagram illustrating another example of the duty-cycle detector 200 depicted in FIG. 1.
Figure 6:
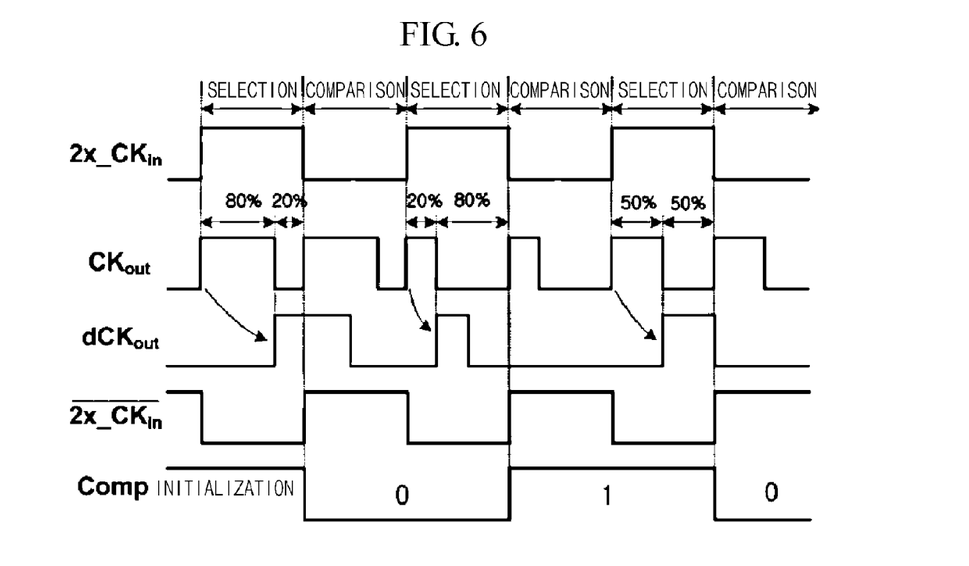
FIG. 6 is a view illustrating wave forms for explaining an operation of the duty cycle detector depicted in FIG. 5.

FIG. 5 is a circuit diagram illustrating another example of the duty-cycle detector 200 depicted in FIG. 1. And, FIG. 6 is a view illustrating wave forms for explaining an operation of the duty cycle detector 200 depicted in FIG. 5.

The duty-cycle detector 200 includes a delayed signal selector 230, an inverter 240, and a D flip-flop 250.

The delayed signal selector 230 delays the output clock signal CKout for a selecting duration of a divided-by-2 signal 2×CKin generated by dividing the input clock signal CKin by two to generate a delayed signal, and outputs the delayed signal for a comparing duration of the divided-by-2 signal 2×CKin.

The inverter 240 inverts the divided-by-2 signal to generate an inverted signal and outputs the inverted signal to the clock terminal of the D flip-flop 250.

The D flip-flop 250 outputs the delayed signal from the delayed signal selector 230 as the duty-rate detection signal Comp according to the inverted signal from the inverter 240.

As shown in FIG. 5, the duty-cycle detector may be implemented with a single bit duty-cycle detector. As shown in FIG. 6, when a signal having the duty-rate of 80:20 as the output clock signal CKout is input and the duty-rate error is first generated as much as the duty-cycle of 80%, the duty-cycle detector stores the duty-rate for the first selecting duration and then, the duty-cycle detector delays the output clock signal CKout to generate the delayed signal dCKout when the level of the output clock signal is changed from "1 (High) to "0 (Low)" corresponding to the duty-rate of 20%. Then, the duty-cycle detector compares the inverted signal of the divided-by-2 signal 2×CKin with the delayed signal dCKout to determine the duty-rate sign. In the present exemplary embodiment, the duty-rate detection signal Comp becomes "1" when the duty-rate is 80%.

Figure 7:
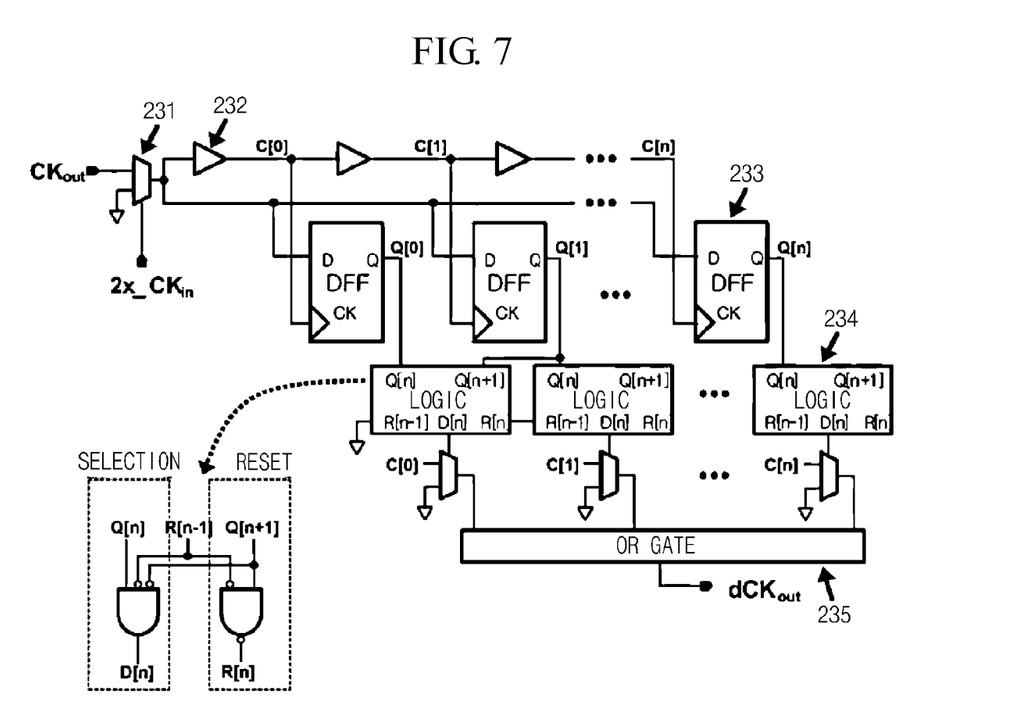
FIG. 7 is a circuit diagram illustrating an example of the delayed signal selector depicted in FIG. 5.

FIG. 7 is a circuit diagram illustrating an example of the delayed signal selector 230 depicted in FIG. 5.

As shown in FIG. 7, the delayed signal selector 230 includes a multiplexor 231, n buffers 232, n D flip-flops 233, n logic circuits 234, and an OR gate 235, where the n is an integer of one or more.

The multiplexor 231 selectively outputs the output clock signal CKout to the n buffers 232 according to the divided-by-2 signal 2×CKin.

The n buffers 232 are connected in serial with one another. The n buffers 232 progressively delays the signal output from the multiplexor 231 and outputs the delayed signals to the n D flip-flops 233, respectively.

The n D flip-flops 233 selectively outputs the output clock signal CKout to the n logic circuits 234 according to delayed signals from the n buffers, respectively.

The n logic circuits 234 compares the signals output from the n D flip-flops with one another to detect level changing portions of the signals, and outputs the detection results to the OR gate 235.

The OR gate 235 selects a signal delayed for a positive duty duration of the output clock signal among the signals output from the n logic circuits 234 and outputs the selected signal as the delayed signal dCKout.

The delayed signal selector 230 depicted in FIG. 7 stores a duty-rate for the selected duration. When the first output clock signal CKout is "1" and the divided-by-2 signal 2×CKin is "0", the n-th signal C[n] of the n buffers 231 has a phase difference which is proportional to the value "n" of the output clock signal CKout. When the signal is compared with the output clock signal CKout, the duration that the output value Q[n] of the n-th D flip-flop is maintained as "1" indicates a magnitude of a duty-rate signal of the output clock signal CKout. The logic circuit 234 indicates the start and end of the stored duty-rate signal, such that when the output clock signal CKout is changed to "0", it outputs the stored duty-rate signal as the delayed signal dCKout.

Figure 8:
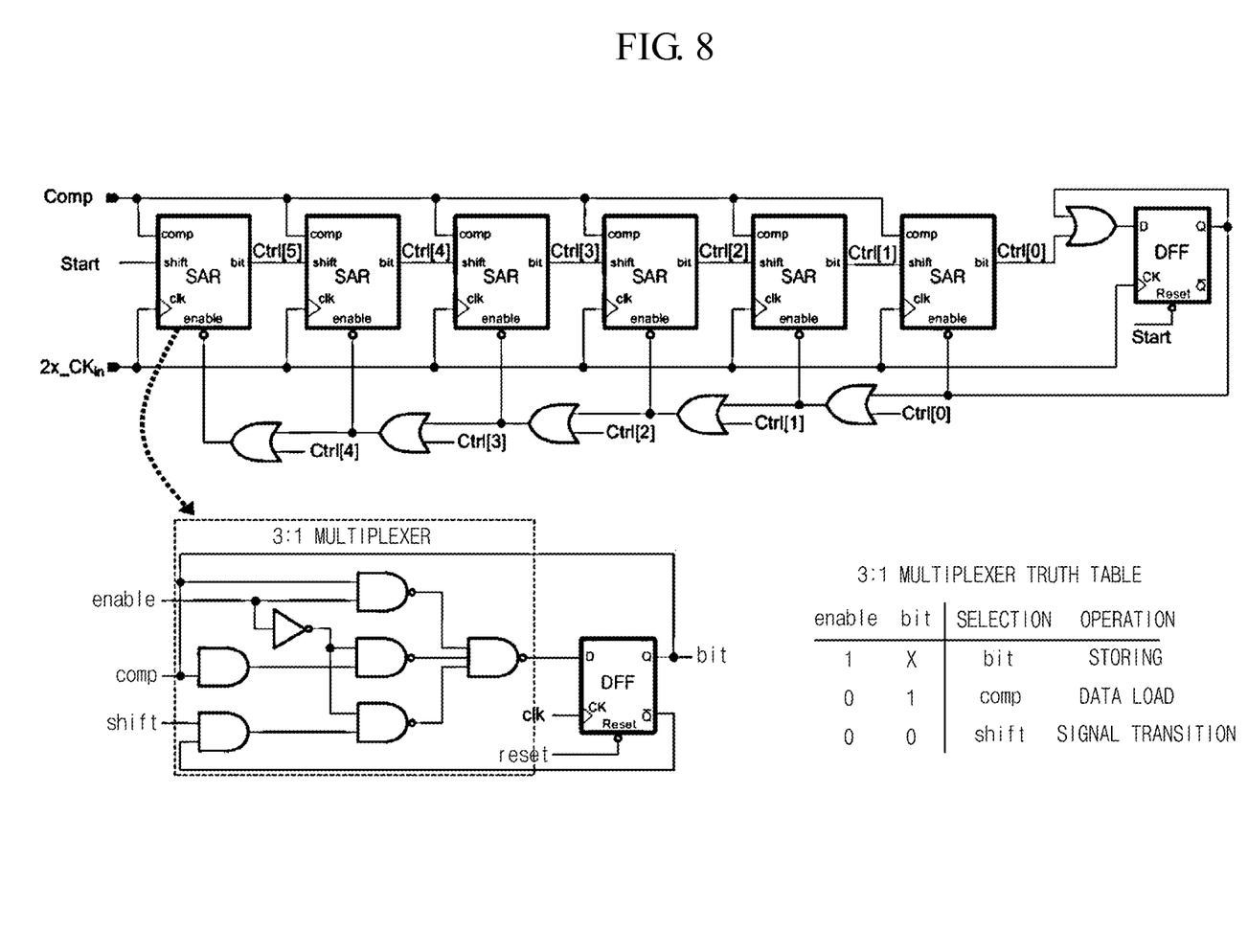
FIG. 8 is a circuit diagram illustrating an example of the SAR algorithm controller 300 depicted in FIG. 1.

FIG. 8 is a circuit diagram illustrating an example of the SAR algorithm controller 300 depicted in FIG. 1.

The SAR algorithm controller 300 depicted in FIG. 8 implements 1-bit SAR algorithm that includes two stages of a data load and a shift right using a 3:1 multiplexer. The SAR algorithm controller 300 transfers a signal after loading data during the first cycle, and during the second cycle, determines whether the signal is stored or reset using the duty-rate detection signal Comp from the duty-cycle detector 200. By repeating the above-mentioned operations at the period of two cycles, values from the MBS to the LBS are determined.

Figure 9:
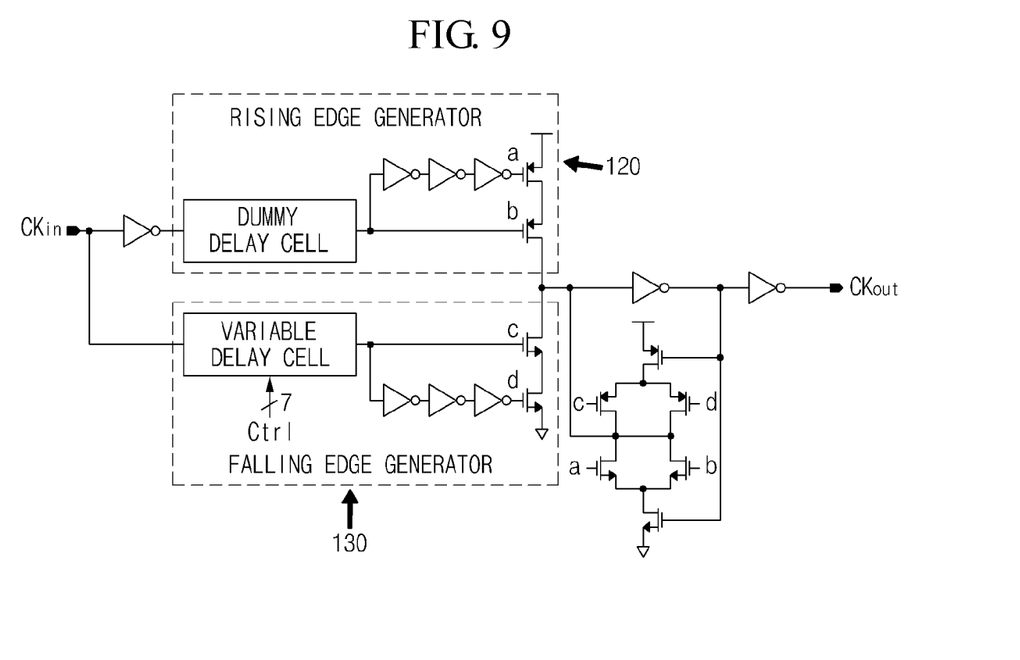
FIG. 9 is a circuit diagram illustrating an example of the duty-cycle adjuster depicted in FIG. 1.

FIG. 9 is a circuit diagram illustrating an example of the duty-cycle adjuster 100 depicted in FIG. 1. And, FIG. 10 is a view illustrating wave forms for explaining the duty-cycle adjuster 100 depicted in FIG. 9.

As depicted in FIG. 9, the duty-cycle adjuster 100 includes an inverter 110 for inverting the input clock signal CKin, a rising edge generator 120 having a dummy delay cell for delay an inverted signal from the inverter for a time period, and a falling edge generator 130 for controlling the number of variable delay cells according to the duty control signal Ctrl to delay the input clock signal CKin.

Figure 10:
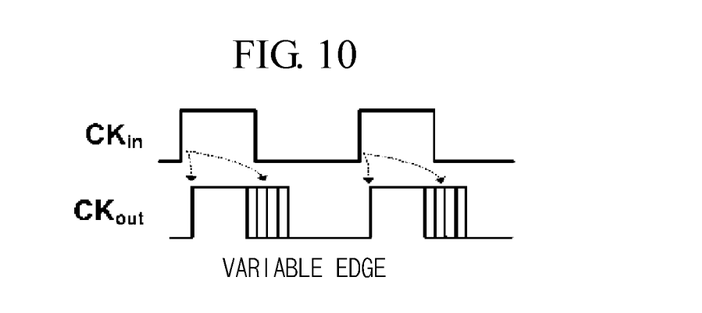
FIG. 10 is a view illustrating wave forms for explaining the duty-cycle adjuster depicted in FIG. 9.

As shown in FIGS. 9 and 10, the falling edge generator 130 varies the number of variable delay cells according to the duty control signal Ctrl from the SAR algorithm controller 300, such that it performs the function of increasing or reducing a fall edge of the output clock signal as shown in FIG. 10. The delay duration of the duty-cycle adjuster 100 continues to be reduced in decrements of half of it. When 7 bits are used, the delay durations of the 7-bit signal include 640 ps, 320 ps, 160 ps, 80 ps, 40 ps, 20 ps, and 10 ps, and the duty-cycle correction error may be adjusted within 1% or less at 350 MHz~1 GHz and duty ratios of 10%~90%.

Figure 11:
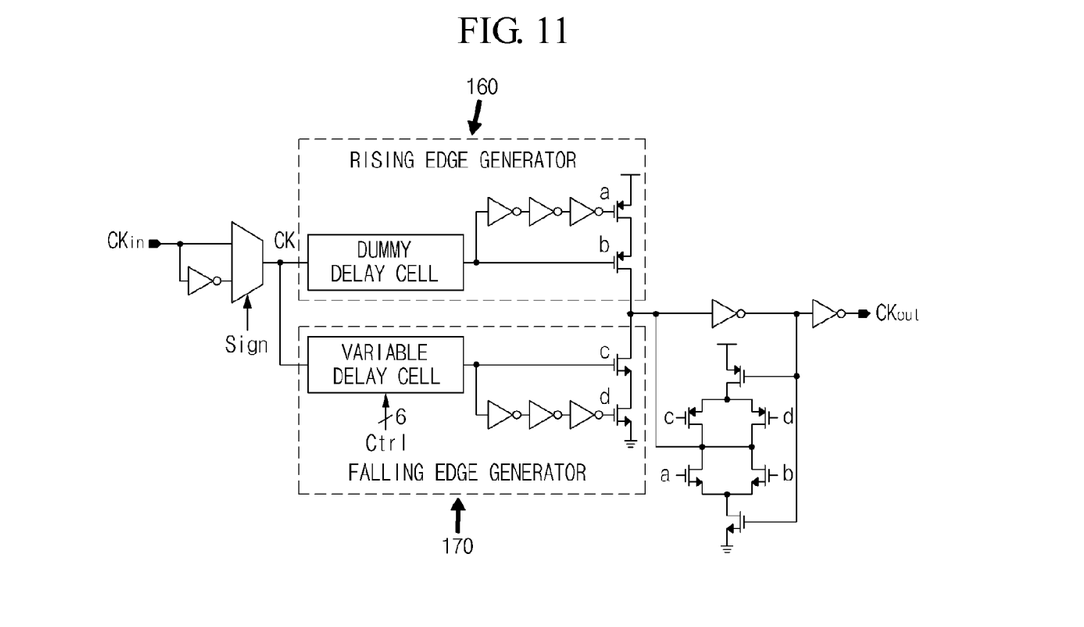
FIG. 11 is a circuit diagram illustrating another example of the duty-cycle adjuster depicted in FIG. 1.

FIG. 11 is a circuit diagram illustrating another example of the duty-cycle adjuster 100 depicted in FIG. 1. And, FIG. 12 is a view illustrating wave forms for explaining the duty-cycle adjuster 100 depicted in FIG. 11.

As depicted in FIG. 11, the duty cycle adjuster 100 includes an inverter 140 for inverting the input clock signal CKin, a multiplexor 150 for selectively outputting an inverted signal from the inverter 140 and the input clock signal CKin according to a sign signal Sign, a rising edge generator 160 having a dummy delay cell for delaying a signal from the multiplexor 150 for a time period, and a falling edge generator 170 for controlling the number of variable delay cells according to the duty control signal Ctrl to delay the signal from the multiplexer 150.

Figure 12:
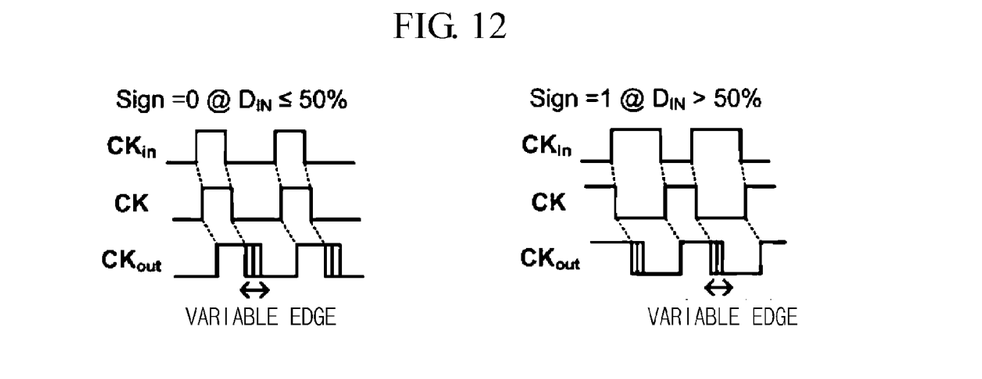
FIG. 12 is a view illustrating wave forms for explaining the duty-cycle adjuster depicted in FIG. 11.

As shown in FIG. 12, the sign signal Sign includes a sign bit for indicating either 50% duty-rate or more, or less. By selecting an edge which is variable according to a sign value of the sign bit Sign, the duty-cycle adjuster 100 may reduce the number of the delay cells. When one bit of the 7 bits is used as the sign bit, delay durations of the 7-bit signal include 320 ps, 160 ps, 80 ps, 40 ps, 20 ps, and 10 ps, such that the number of the delay cells is reduced.

Figure 13:
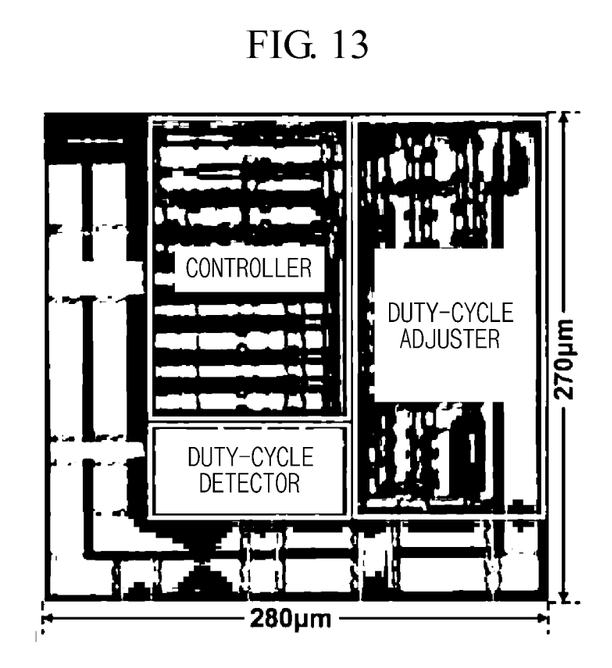
FIG. 13 is a photograph showing a semiconductor chip of a duty-cycle correction circuit manufactured by a process.

FIG. 13 is a photograph showing a semiconductor chip of a duty-cycle correction circuit manufactured by a process. A single-poly 6-metal CMOS process of 0.13 μm is used for manufacturing the chip. The size of the chip is 280 μm×270 μm.

Figure 14:
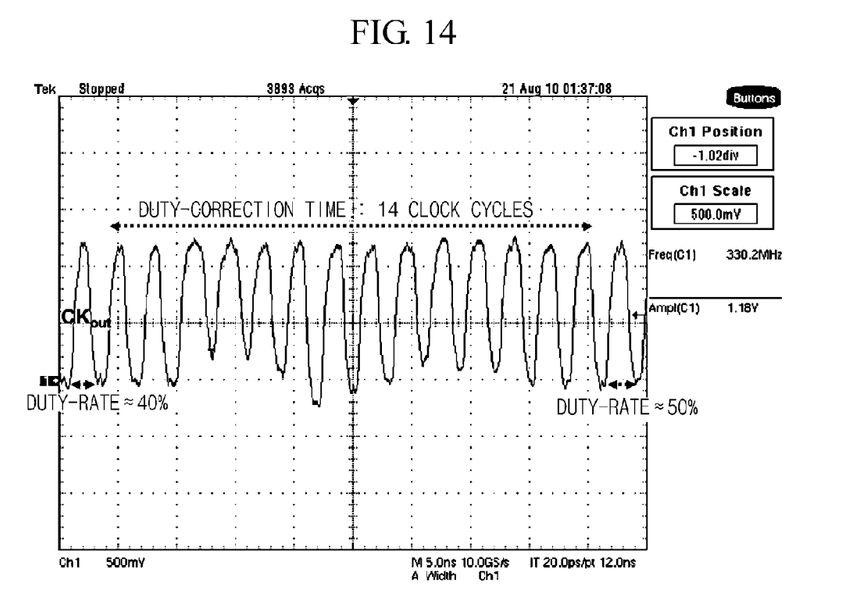
FIG. 14 is a view showing a test result of a manufactured duty-cycle correction circuit.

FIG. 14 is a view showing a test result of a manufactured duty-cycle correction circuit. As shown in FIG. 14, an input signal of 60:40 duty-rate is varied in its duty-cycle every two cycles. And, it is shown to output a signal of 50:50 duty-cycle at 14 cycles.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A circuit for correcting a duty-cycle comprising:
   a duty-cycle adjuster for changing a duty-rate of an input clock signal according to a duty control signal;
   a duty-cycle detector for detecting a duty-rate of an output clock signal based on the input clock signal and the output clock signal from the duty-cycle adjuster; and an algorithm-based digital controller for performing an algorithm according to a duty-rate detection signal outputted from the duty-cycle detector to generate the duty control signal, wherein the algorithm-based digital controller includes a successive approximation register (SAR) controller performs a SAR algorithm according to the duty-rate detection signal to generate the duty control signal.

2. The circuit of claim 1, wherein the duty cycle adjuster includes:

an inverter for inverting the input clock signal;

a rising edge generator having a dummy delay line for delay an inverted signal from the inverter for a time period; and a falling edge generator for controlling the number of variable delay cells according to the duty control signal to delay the input clock signal.

3. The circuit of claim 1, wherein the duty cycle adjuster includes:

an inverter for inverting the input clock signal;

a multiplexor for selectively outputting an inverted signal from the inverter and the input clock signal according to a sign signal corresponding to a duty-rate of the input clock signal;

a rising edge generator having a dummy delay line for delaying a signal from the multiplexor for a time period; and a falling edge generator for controlling the number of variable delay cells according to the duty control signal to delay the signal from the multiplexor.

4. A circuit for correcting a duty-cycle comprising:

a duty-cycle adjuster for changing a duty-rate of an input clock signal according to a duty control signal;

a duty-cycle detector for detecting a duty-rate of an output clock signal based on the input clock signal and the output clock signal from the duty-cycle adjuster; and an algorithm-based digital controller for performing an algorithm according to a duty-rate detection signal outputted from the duty-cycle detector to generate the duty control signal, wherein the duty-cycle detector includes:

an integrator for integrating a duty-rate difference of the output clock signal; and a latch for amplifying the duty-rate difference stored in the integrator to generate the duty-rate detection signal.

5. The circuit of claim 4, wherein the duty cycle adjuster includes:

an inverter for inverting the input clock signal;

a rising edge generator having a dummy delay line for delay an inverted signal from the inverter for a time period; and a falling edge generator for controlling the number of variable delay cells according to the duty control signal to delay the input clock signal.

6. The circuit of claim 4, wherein the duty cycle adjuster includes:

an inverter for inverting the input clock signal;

a multiplexor for selectively outputting an inverted signal from the inverter and the input clock signal according to a sign signal corresponding to a duty-rate of the input clock signal;

a rising edge generator having a dummy delay line for delaying a signal from the multiplexor for a time period; and a falling edge generator for controlling the number of variable delay cells according to the duty control signal to delay the signal from the multiplexor.

7. A circuit for correcting a duty-cycle comprising:

a duty-cycle adjuster for changing a duty-rate of an input clock signal according to a duty control signal;

a duty-cycle detector for detecting a duty-rate of an output clock signal based on the input clock signal and the output clock signal from the duty-cycle adjuster; and an algorithm-based digital controller for performing an algorithm according to a duty-rate detection signal outputted from the duty-cycle detector to generate the duty control signal, wherein the duty-cycle detector includes:

a delayed signal selector for delaying the output clock signal for a selecting duration of a divided-by-2 signal generated by dividing the input clock signal by two to generate a delayed signal and for outputting the delayed signal for a comparing duration of the divided-by-2 signal;

an inverter for inverting the divided-by-2 signal; and a D flip-flop for outputting the delayed signal according to an inverted signal from the inverter, as the duty-rate detection signal.

8. The circuit of claim 7, wherein the delayed signal selector includes:

a multiplexor for selecting the output clock signal according to the divided-by-2 signal;

n buffers connected in serial with one another for progressively delaying a signal output from the multiplexor;

n D flip-flops for selectively outputting the output clock signal according to delayed signals from the n buffers;

n logic circuits for detecting a level changing portion by comparing signals output from the n D flip-flops with one another; and an OR gate for selecting a signal delayed for a positive duty duration of the output clock signal among signals output from the n logic circuits.

9. The circuit of claim 8, wherein the duty cycle adjuster includes:

an inverter for inverting the input clock signal;

a rising edge generator having a dummy delay line for delay an inverted signal from the inverter for a time period; and a falling edge generator for controlling the number of variable delay cells according to the duty control signal to delay the input clock signal.

10. The circuit of claim 8, wherein the duty cycle adjuster includes:

an inverter for inverting the input clock signal;

a multiplexor for selectively outputting an inverted signal from the inverter and the input clock signal according to a sign signal corresponding to a duty-rate of the input clock signal;

a rising edge generator having a dummy delay line for delaying a signal from the multiplexor for a time period; and a falling edge generator for controlling the number of variable delay cells according to the duty control signal to delay the signal from the multiplexor.

11. The circuit of claim 7, wherein the duty cycle adjuster includes:

an inverter for inverting the input clock signal;

a rising edge generator having a dummy delay line for delay an inverted signal from the inverter for a time period; and a falling edge generator for controlling the number of variable delay cells according to the duty control signal to delay the input clock signal.

12. The circuit of claim 7, wherein the duty cycle adjuster includes:
   an inverter for inverting the input clock signal;
   a multiplexor for selectively outputting an inverted signal from the inverter and the input clock signal according to a sign signal corresponding to a duty-rate of the input clock signal;
   a rising edge generator having a dummy delay line for delaying a signal from the multiplexor for a time period; and
   a falling edge generator for controlling the number of variable delay cells according to the duty control signal to delay the signal from the multiplexer.

13. A circuit for correcting a duty-cycle comprising:
   a duty-cycle adjuster for changing a duty-rate of an input clock signal according to a duty control signal;
   a duty-cycle detector for detecting a duty-rate of an output clock signal based on the input clock signal and the output clock signal from the duty-cycle adjuster; and
   an algorithm-based digital controller for performing an algorithm according to a duty-rate detection signal outputted from the duty-cycle detector to generate the duty control signal,
   wherein the duty cycle adjuster includes:
   an inverter for inverting the input clock signal;
   a rising edge generator having a dummy delay line for delay an inverted signal from the inverter for a time period; and
   a falling edge generator for controlling the number of variable delay cells according to the duty control signal to delay the input clock signal.

14. A circuit for correcting a duty-cycle comprising:
   a duty-cycle adjuster for changing a duty-rate of an input clock signal according to a duty control signal;
   a duty-cycle detector for detecting a duty-rate of an output clock signal based on the input clock signal and the output clock signal from the duty-cycle adjuster; and
   an algorithm-based digital controller for performing an algorithm according to a duty-rate detection signal outputted from the duty-cycle detector to generate the duty control signal,
   wherein the duty cycle adjuster includes:
   an inverter for inverting the input clock signal;
   a multiplexor for selectively outputting an inverted signal from the inverter and the input clock signal according to a sign signal corresponding to a duty-rate of the input clock signal;
   a rising edge generator having a dummy delay line for delaying a signal from the multiplexor for a time period; and
   a falling edge generator for controlling the number of variable delay cells according to the duty control signal to delay the signal from the multiplexer.

* * * * *